(12) United States Patent
Ha et al.

(10) Patent No.: US 7,420,269 B2
(45) Date of Patent: Sep. 2, 2008

(54) STACKED INTEGRATED CIRCUIT PACKAGE-IN-PACKAGE SYSTEM

(75) Inventors: Jong-Woo Ha, Seoul (KR); Gwang Kim, Jr., Kyoungki-do (KR); JuHyun Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 155 days.

(21) Appl. No.: 11/379,097

(22) Filed: Apr. 18, 2006

(65) Prior Publication Data
US 2007/0241442 A1 Oct. 18, 2007

(51) Int. Cl.
H01L 23/02 (2006.01)
H01L 23/34 (2006.01)
H01L 23/48 (2006.01)
H01L 23/52 (2006.01)
H01L 29/40 (2006.01)

(52) U.S. Cl. ............... 257/686; 257/685; 257/723; 257/777

(58) Field of Classification Search ......... 257/685–686, 257/723, 777
See application file for complete search history.

(56) References Cited

U.S. PATENT DOCUMENTS

| | | | | |
|---|---|---|---|---|
| 5,373,189 A * | 12/1994 | Massit et al. | ............... | 257/686 |
| 5,998,864 A * | 12/1999 | Khandros et al. | ............ | 257/723 |
| 6,215,182 B1 * | 4/2001 | Ozawa et al. | ............... | 257/723 |
| 6,433,421 B2 * | 8/2002 | Masuda et al. | ............... | 257/723 |
| 6,476,506 B1 * | 11/2002 | O'Connor et al. | ............. | 257/786 |
| 6,605,875 B2 | 8/2003 | Eskildsen | | |
| 6,621,155 B1 * | 9/2003 | Perino et al. | ................. | 257/686 |
| 6,885,106 B1 | 4/2005 | Damberg et al. | | |
| 6,900,528 B2 * | 5/2005 | Mess et al. | .................... | 257/686 |
| 6,946,323 B1 | 9/2005 | Heo | | |
| 6,972,481 B2 | 12/2005 | Karnezos | | |
| 7,015,586 B2 * | 3/2006 | Chien | ........................... | 257/777 |
| 7,095,104 B2 * | 8/2006 | Blackshear | .................. | 257/679 |
| 7,224,075 B2 * | 5/2007 | Manepalli et al. | ............ | 257/783 |
| 7,262,506 B2 * | 8/2007 | Mess et al. | .................... | 257/777 |
| 2003/0189256 A1 * | 10/2003 | Corisis et al. | ................ | 257/777 |
| 2005/0029645 A1 * | 2/2005 | Mess et al. | .................... | 257/686 |
| 2005/0067694 A1 * | 3/2005 | Pon et al. | ...................... | 257/723 |
| 2006/0091518 A1 * | 5/2006 | Grafe et al. | ................. | 257/686 |
| 2006/0267173 A1 * | 11/2006 | Takiar et al. | ................. | 257/686 |
| 2007/0052079 A1 * | 3/2007 | Tsai et al. | .................... | 257/685 |

* cited by examiner

*Primary Examiner*—Ida M Soward
(74) *Attorney, Agent, or Firm*—Mikio Ishimaru

(57) ABSTRACT

A stacked integrated circuit package-in-package system is provided forming a first integrated circuit package having a first peripheral contact, forming a second integrated circuit package having a second peripheral contact, stacking the second integrated circuit package on the first integrated circuit package in an offset configuration with the first peripheral contact exposed, the offset configuration provides a second package overhang with the second integrated circuit package above the first integrated circuit package, electrically connecting the first peripheral contact and a package substrate top contact, and electrically connecting the second peripheral contact and the package substrate top contact.

18 Claims, 4 Drawing Sheets

STACKED INTEGRATED CIRCUIT PACKAGE-IN-PACKAGE SYSTEM

CROSS-REFERENCE TO RELATED APPLICATIONS

The present application contains subject matter related to concurrently filed U.S. patent application Ser. No. 11/379,106. The related application is assigned to STATS ChipPAC Ltd.

TECHNICAL FIELD

The present invention relates generally to integrated circuit packages and more particularly to stacked integrated circuit package system.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

Numerous package approaches stack multiple integrated circuit dice or package in package (PIP) or a combination thereof. The electrical connections to the each of the stacked integrated circuit require space typically formed by spacers, such as silicon or interposers. Current spacers require additional steps and structures increasing manufacturing costs and decreasing manufacturing yields. These spacers also limit the amount of height reduction.

Thus, a need still remains for a stacked integrated circuit package-in-package system providing low cost manufacturing, improved yields, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package-in-package system including forming a first integrated circuit package having a first peripheral contact, forming a second integrated circuit package having a second peripheral contact, stacking the second integrated circuit package on the first integrated circuit package in an offset configuration with the first peripheral contact exposed, the offset configuration provides a second package overhang with the second integrated circuit package above the first integrated circuit package, electrically connecting the first peripheral contact and a package substrate contact, and electrically connecting the second peripheral contact and the package substrate contact.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
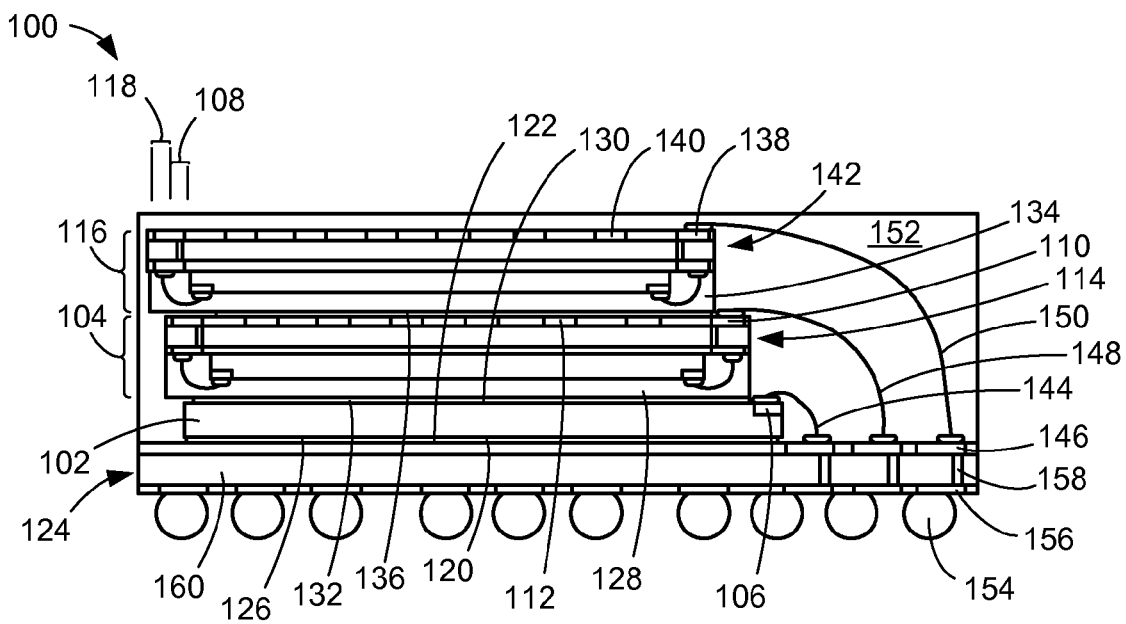
FIG. 1 is a cross-sectional view of a first stacked integrated circuit package-in-package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of a first stacked integrated circuit package-in-package system 100 in an embodiment of the present invention. The first stacked integrated circuit package-in-package system 100 packs more integrated circuits while decreasing overall package height, simplifying manufacturing process, increasing yield, and reducing the overall cost through an offset stack configuration.

The offset stack configuration has an integrated circuit die 102 stacked below a first integrated circuit package system 104. The first integrated circuit package system 104 is offset from the integrated circuit die 102 exposing bond pads 106 of the integrated circuit die 102. A portion of the first integrated circuit package system 104 extends laterally beyond the integrated circuit die 102 forming a first package overhang 108. The first integrated circuit package system 104 includes first peripheral contacts 110, such as terminal pads, and first inner contacts 112, such as terminal pads, of a first package substrate 114. A second integrated circuit package system 116 attaches above the first integrated circuit package system 104 in an offset configuration exposing the first peripheral contacts 110, such as terminal pads, for further electrical connections and covering the first inner contacts 112, such as terminal pads. The second integrated circuit package system 116 extends laterally beyond the first integrated circuit package system 104 forming a second package overhang 118.

Separate spacers, such as silicon spacers or interposer structures, are not used in this stacking configuration resulting in reduced manufacture steps, improved yield, reduced package height, and reduced cost. The integrated circuit die 102, the first integrated circuit package system 104, and the second integrated circuit package system 116 may be tested before assembly in the first stacked integrated circuit package-in-package system 100 ensuring known good devices (KGD) and increasing yield.

A non-active side 120 of the integrated circuit die 102 attaches on a package substrate top surface 122 of a package substrate 124 with a die-attach adhesive 126. The offset stack configuration has a first encapsulation 128 of the first integrated circuit package system 104 attached on an active side 130 of the integrated circuit die 102 with a first adhesive 132.

A second encapsulation 134 of the second integrated circuit package system 116 attaches on the first package substrate 114 of the first integrated circuit package system 104 with a second adhesive 136, such as an electrically nonconductive adhesive. The second integrated circuit package system 116 includes second peripheral contacts 138, such as terminal pads, and second inner contacts 140, such as terminal pads, of a second package substrate 142. The second integrated circuit package system 116 is offset exposing the first peripheral contacts 110 of the first integrated circuit package system 104 for further electrical connections.

Die interconnects 144, such as bond wires, connect the bond pads 106 of the integrated circuit die 102 and package substrate top contacts 146, such as bond fingers, at the package substrate top surface 122. First interconnects 148, such as bond wires, connect the first peripheral contacts 110 and the package substrate top contacts 146. Second interconnects 150, such as bond wires, connect the second peripheral contacts 138 of the second integrated circuit package system 116 and the package substrate top contacts 146. This offset connection structure allows the adhesives, such as the die-attach adhesive 126, the first adhesive 132, and the second adhesive 136, to be thinner and allows larger loop heights of the interconnects, such as the die interconnects 144, the first interconnects 148, and the second interconnects 150, reducing the height of the first stacked integrated circuit package-in-package system 100.

A package encapsulation 152, such as an epoxy mold compound, covers the integrated circuit die 102, the first integrated circuit package system 104, the second integrated circuit package system 116, the die interconnects 144, the first interconnects 148, and the second interconnects 150. External interconnects 154, such as solder balls, attach on a package substrate bottom contacts 156 for further connections to a next system level (not shown), such as a printed circuit board or another integrated circuit package.

The package substrate bottom contacts 156 and the package substrate top contacts 146 may be part of conductive traces (not shown) in the package substrate 124. Electrical vias 158 connect the package substrate bottom contacts 156, the package substrate top contacts 146, and other conductive traces in a predetermined configuration. An insulation 160, such as a dielectric, isolates the conductive traces from each other and the Electrical vias 158 from each other as well as provides structural support for the package substrate 124. For illustrative purpose, the package substrate 124 is shown as a two layer substrate, although it is understood that the number of layers may be different.

Figure 2:
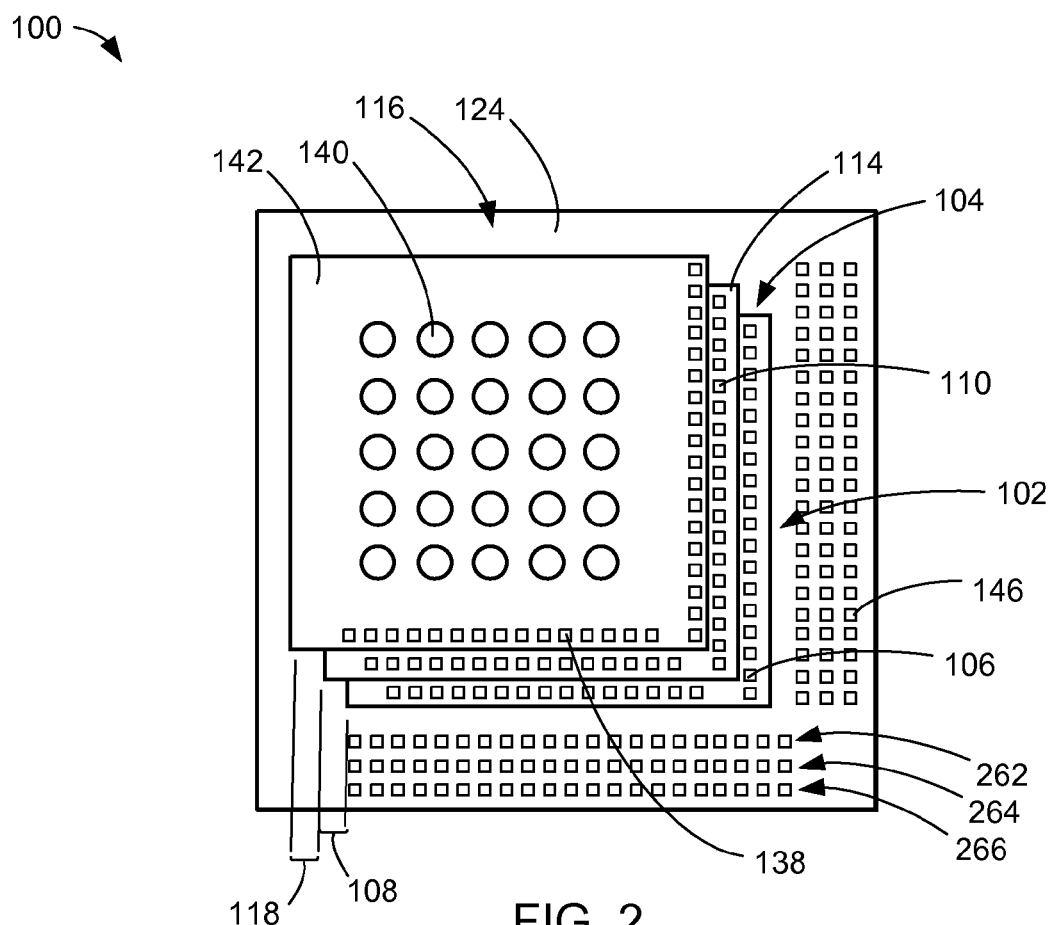
FIG. 2 is a plan view of the first stacked integrated circuit package-in-package system.

Referring now to FIG. 2, therein is shown a plan view of the first stacked integrated circuit package-in-package system 100. The offset stack configuration has the integrated circuit die 102 above the package substrate 124 with rows of the package substrate top contacts 146 exposed. The first integrated circuit package system 104 is above and offset from the integrated circuit die 102 exposing the bond pads 106 and forming the first package overhang 108. The second integrated circuit package system 116 is above and offset from the first integrated circuit package system 104 exposing the first peripheral contacts 110 on the first package substrate 114 and forming the second package overhang 118. The offset of the second integrated circuit package system 116 also exposes the bond pads 106. The second inner contacts 140 are shown on the second package substrate 142.

The bond pads 106 connect to a first row 262, the inner most row, of the package substrate top contacts 146. The first peripheral contacts 110 connect to a second row 264 of the package substrate top contacts 146. The second peripheral contacts 138 connect to a third row 266, the outer most row, of the package substrate top contacts 146. This connection structure allows for connections to the integrated circuit devices in the stack without adverse wire crossing.

For illustrative purpose, two adjacent sides of the package substrate 124, the integrated circuit die 102, the first integrated circuit package system 104, and the second integrated circuit package system 116 are exposed allowing further connections, although it is understood that a different number of sides may be exposed. Also for illustrative purpose, the integrated circuit die 102, the first integrated circuit package system 104, and the second integrated circuit package system 116 are substantially same in length and width, although it is understood that the lengths, widths, or both may differ.

Further for illustrative purpose, the offset stack configuration is shown in one direction exposing the same adjacent sides of the integrated circuit die 102, the first integrated circuit package system 104, and the second integrated circuit package system 116, although it is understood that different sides in the stack may be exposed in a different pattern, such as not in one direction. Yet further for illustrative purpose, the interconnects are shown connecting to the package substrate 124, although it is understood that the interconnects may connect the devices in the offset stack configuration to each other.

Figure 3:
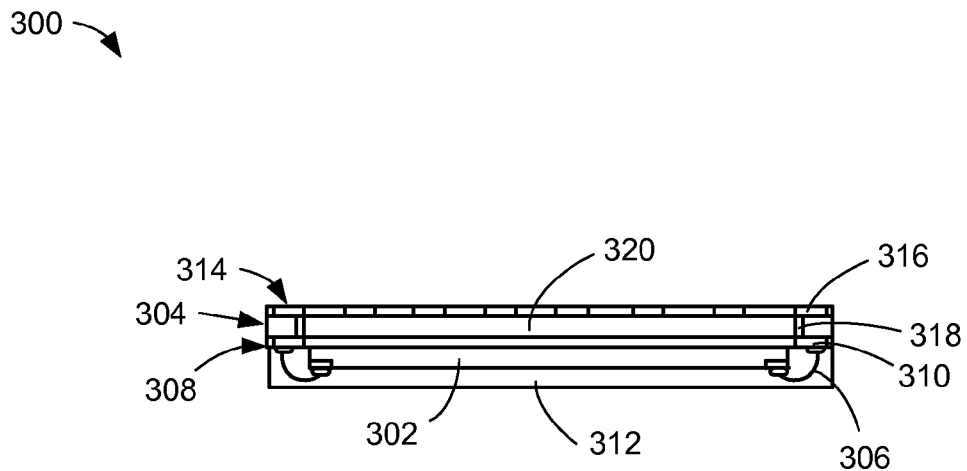
FIG. 3 is a cross-sectional view of an integrated circuit package system in an embodiment of the present invention.

Referring now to FIG. 3, therein is shown a cross-sectional view of an integrated circuit package system 300 in an embodiment of the present invention. The integrated circuit package system 300 may represent a structure for the first integrated circuit package system 104 of FIG. 1 and the second integrated circuit package system 116 of FIG. 1. The integrated circuit package system 300 is the package inside the first stacked integrated circuit package-in-package system 100 of FIG. 1.

The integrated circuit package system 300 includes an integrated circuit die 302 attached on a substrate 304, such as an organic or inorganic carrier. Interconnects 306, such as bond wires, connect the integrated circuit die 302 to a first metal layer 308 of the substrate 304. The first metal layer 308 connects to first contacts 310, such as bond fingers.

An encapsulation 312 covers and protects the integrated circuit die 302 and the interconnects 306. The encapsulation 312 also protects the integrated circuit package system 300 withstanding the stacking process and the encapsulation process forming the first stacked integrated circuit package-in-package system 100.

The substrate 304 also includes a second metal layer 314 for connections of the integrated circuit package system 300 to a next system level, such as the package substrate 124 of FIG. 1, a printed circuit board (not shown), or another integrated circuit package (not shown). The second metal layer 314 connects to second contacts 316, such as terminal pads, peripheral contacts, or inner contacts, on a side opposite of the substrate 304 to the first contacts 310. Electrical vias 318 connect traces of the first metal layer 308 to the second metal layer 314 in a predetermined configuration. An insulation 320, such as a dielectric, isolates the traces of the first metal layer 308 from each other, the traces of the second metal layer 314 from each other, the electrical vias 318 from each other, and the first metal layer 308 with the second metal layer 314 as well as provides structural support for the substrate 304.

For illustrative purpose, the integrated circuit die 302 is shown as a bare die, although it is understood that the integrated circuit die 302 may not be bare. Also for illustrative purpose, the substrate 304 is shown as having two layers of metal, although it is understood that the number layers may differ. Further for illustrative purpose, the integrated circuit package system 300 is shown not having stacked integrated circuits, although it is understood that the integrated circuit package system 300 may also have stacked integrated circuits as well as may have package-in-package configuration.

Figure 4:
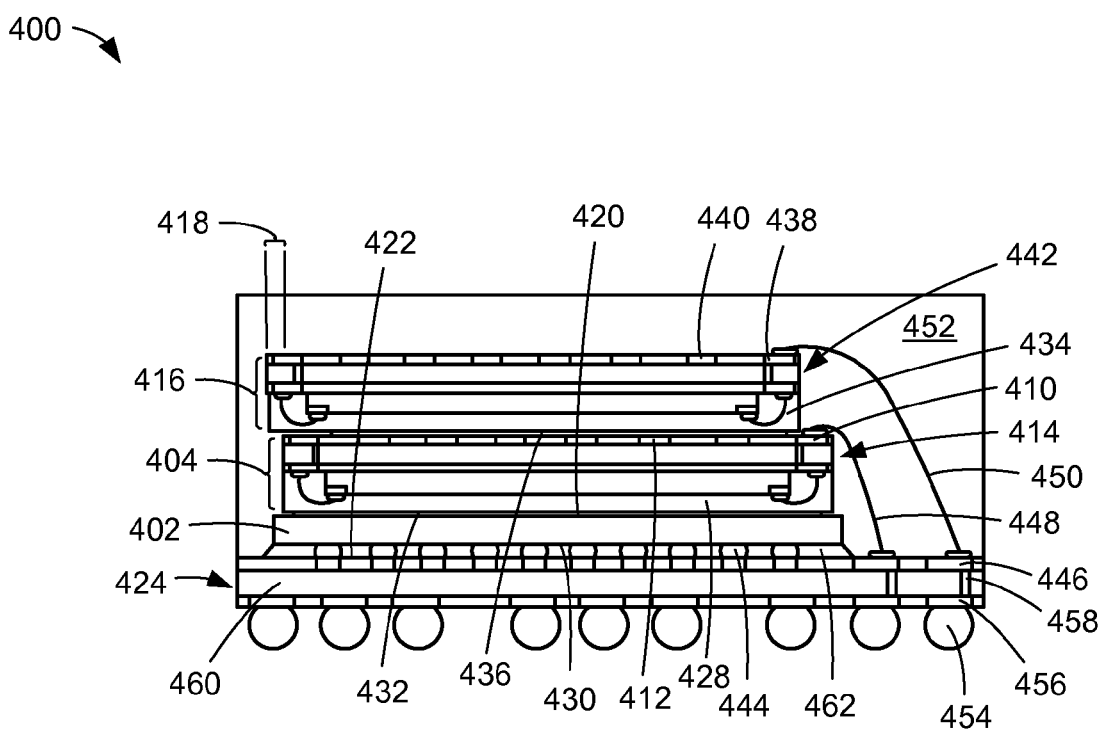
FIG. 4 is a cross-sectional view of a second stacked integrated circuit package-in-package system in an alternative embodiment of the present invention.

Referring now to FIG. 4, therein is shown a cross-sectional view of a second stacked integrated circuit package-in-package system 400 in an alternative embodiment of the present invention. The second stacked integrated circuit package-in-package system 400 also packs more integrated circuits while decreasing overall package height, simplifying manufacturing process, increasing yield, and reducing the overall cost through an offset stack configuration.

The offset stack configuration has an integrated circuit die 402 stacked below a first integrated circuit package system 404. The first integrated circuit package system 404 includes first peripheral contacts 410, such as terminal pads, and first inner contacts 412, such as terminal pads, of a first package substrate 414. A second integrated circuit package system 416 attaches above the first integrated circuit package system 404 in an offset configuration exposing the first peripheral contacts 410 for further electrical connections and covering the first inner contacts 412, such as terminal pads. The second integrated circuit package system 416 extends laterally beyond the first integrated circuit package system 404 forming a second package overhang 418.

Separate spacers, such as silicon spacers or interposer structures, are not used in this stacking configuration resulting in reduced manufacture steps, improved yield, reduced package height, and reduced cost. The integrated circuit die 402, the first integrated circuit package system 404, and the second integrated circuit package system 416 may be tested before assembly in the second stacked integrated circuit package-in-package system 400 ensuring known good devices (KGD) and increasing yield.

The offset stack configuration has a first encapsulation 428 of the first integrated circuit package system 404 attached on a non-active side 420 of the integrated circuit die 402, such as a flip chip, with a first adhesive 432. The integrated circuit die 402 attaches on a package substrate top surface 422 of a package substrate 424 with die interconnects 444, such as solder bumps. An underfill encapsulation 462 covers an active side 430 of the integrated circuit die 402 and fills the space between the die interconnects 444.

A second encapsulation 434 of the second integrated circuit package system 416 attaches on the first package substrate 414 of the first integrated circuit package system 404 with a second adhesive 436, such as an electrically nonconductive adhesive. The second integrated circuit package system 416 includes second peripheral contacts 438, such as terminal pads, and second inner contacts 440, such as terminal pads, of a second package substrate 442. The second integrated circuit package system 416 is offset exposing the first peripheral contacts 410 of the first integrated circuit package system 404 for further electrical connections and forming the second package overhang 418.

First interconnects 448, such as bond wires, connect the first peripheral contacts 410 and package substrate top contacts 446, such as bond fingers, at the package substrate top surface 422. Second interconnects 450, such as bond wires, connect the second peripheral contacts 438 of the second integrated circuit package system 416 and the package substrate top contacts 446. This offset connection structure allows the adhesives, such as the first adhesive 432 and the second adhesive 436, to be thinner and allows larger loop heights of the interconnects, such as the first interconnects 448 and the second interconnects 450, reducing the height of the second stacked integrated circuit package-in-package system 400.

A package encapsulation 452, such as an epoxy mold compound, covers the integrated circuit die 402, the first integrated circuit package system 404, the second integrated circuit package system 416, the first interconnects 448, and the second interconnects 450. External interconnects 454, such as solder balls, attach on package substrate bottom contacts 456 for further connections to a next system level (not shown), such as a printed circuit board or another integrated circuit package.

The package substrate bottom contacts 456 and the package substrate top contacts 446 may be part of conductive traces (not shown) in the package substrate 424. Electrical vias 458 connect the package substrate bottom contacts 456, the package substrate top contacts 446, and other conductive traces in a predetermined configuration. An insulation 460, such as a dielectric, isolates the conductive traces from each other and the Electrical vias 458 from each other as well as provides structural support for the package substrate 424. For illustrative purpose, the package substrate 424 is shown as a two layer substrate, although it is understood that the number of layers may be different.

Figure 5:
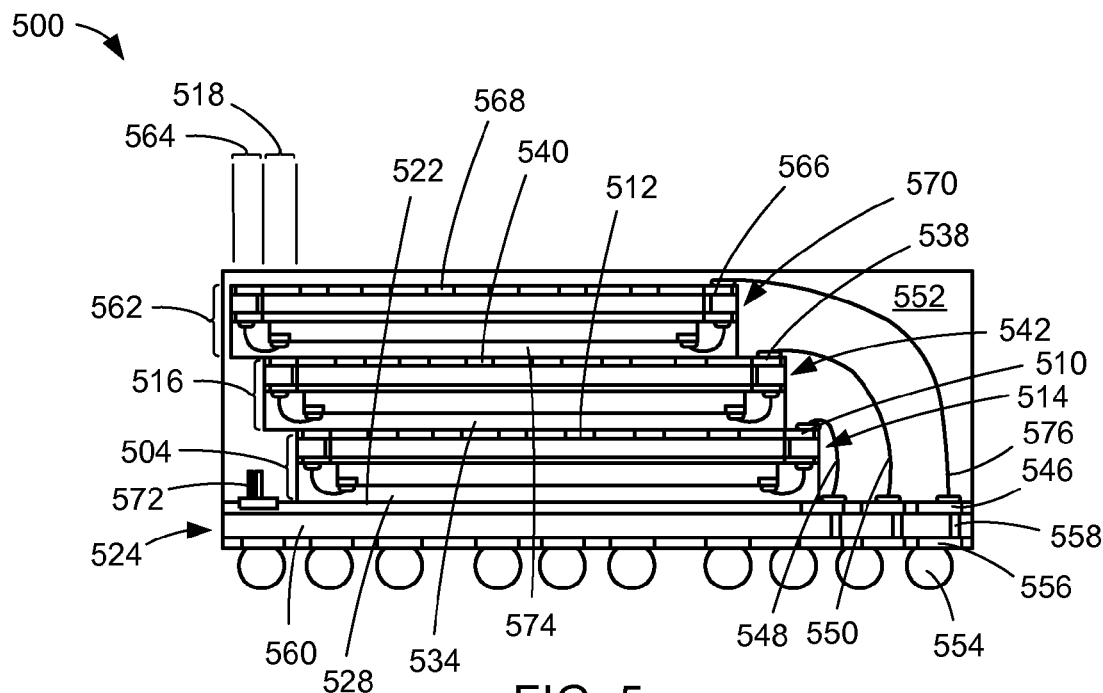
FIG. 5 is a cross-sectional view of a third stacked integrated circuit package-in-package system in another alternative embodiment of the present invention.

Referring now to FIG. 5, therein is shown a cross-sectional view of a third stacked integrated circuit package-in-package system 500 in another alternative embodiment of the present invention. The third stacked integrated circuit package-in-package system 500 also packs more integrated circuits while decreasing overall package height, simplifying manufacturing process, increasing yield, and reducing the overall cost through an offset stack configuration.

The offset stack configuration has a first integrated circuit package system 504 stacked below a second integrated circuit package system 516. The first integrated circuit package system 504 includes first peripheral contacts 510, such as terminal pads, and first inner contacts 512, such as terminal pads, on a first package substrate 514.

The second integrated circuit package system 516 is offset from the first integrated circuit package system 504 exposing the first peripheral contacts 510 and covering the first inner contacts 512, such as terminal pads. The second integrated circuit package system 516 extends laterally beyond the first integrated circuit package system 504 forming a second package overhang 518. The second integrated circuit package system 516 includes second peripheral contacts 538, such as terminal pads, and second inner contacts 540, such as terminal pads, on a second package substrate 542.

A third integrated circuit package system 562 attaches above the second integrated circuit package system 516 in an offset configuration exposing the second peripheral contacts 538 and covering the second inner contacts 540. The third integrated circuit package system 562 extends laterally beyond the second integrated circuit package system 516 forming a third package overhang 564. The third integrated circuit package system 562 includes third peripheral contacts 566, such as terminal pads, and third inner contacts 568, such as terminal pads, of a third package substrate 570. A small component 572 is attached on a package substrate top surface 522 next to the first integrated circuit package system 504 and below the second integrated circuit package system 516.

Separate spacers, such as silicon spacers or interposer structures, are not used in this stacking configuration resulting in reduced manufacture steps, improved yield, reduced package height, and reduced cost. The first integrated circuit package system 504, the second integrated circuit package system 516, and the third integrated circuit package system 562 may be tested before assembly in the third stacked integrated circuit package-in-package system 500 ensuring known good devices (KGD) and increasing yield.

A first encapsulation 528 of the first integrated circuit package system 504 attaches on the package substrate top surface 522 of a package substrate 524. The offset stack configuration has a second encapsulation 534 of the second integrated circuit package system 516 attached on the first package substrate 514. A third encapsulation 574 of the third integrated circuit package system 562 attaches on the second package substrate 542.

First interconnects 548, such as bond wires, connect the first peripheral contacts 510 and package substrate top contacts 546, such as bond fingers, at the package substrate top surface 522. Second interconnects 550, such as bond wires, connect the second peripheral contacts 538 and the package substrate top contacts 546. Third interconnects 576, such as bond wires, connect the third peripheral contacts 566 of the third integrated circuit package system 562 and the package substrate top contacts 546. This offset connection structure allows larger loop heights of the interconnects, such as the first interconnects, the second interconnects 550, and the third interconnects 576.

A package encapsulation 552, such as an epoxy mold compound, covers the first integrated circuit package system 504, the second integrated circuit package system 516, the third integrated circuit package system 562, the first interconnects 548, the second interconnects 550, and the third interconnects 576. External interconnects 554, such as solder balls, attach on package substrate bottom contacts 556 for further connections to a next system level (not shown), such as a printed circuit board or another integrated circuit package.

The package substrate bottom contacts 556 and the package substrate top contacts 546 may be part of conductive traces (not shown) in the package substrate 524. Electrical vias 558 connect the package substrate bottom contacts 556, the package substrate top contacts 546, and other conductive traces in a predetermined configuration. An insulation 560, such as a dielectric, isolates the conductive traces from each other and the Electrical vias 558 from each other as well as provides structural support for the package substrate 524. For illustrative purpose, the package substrate 524 is shown as a two layer substrate, although it is understood that the number of layers may be different.

Figure 6:
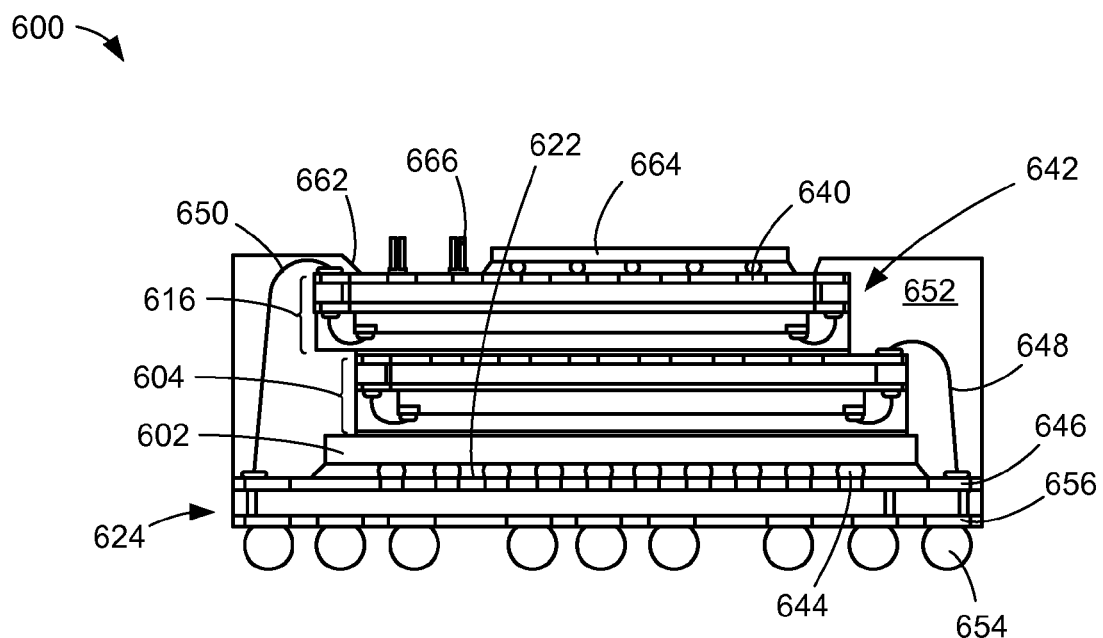
FIG. 6 is a cross-sectional view of a fourth stacked integrated circuit package-in-package system in yet another alternative embodiment of the present invention.

Referring now to FIG. 6, therein is shown a cross-sectional view of a fourth stacked integrated circuit package-in-package system 600 in yet another alternative embodiment of the present invention. The fourth stacked integrated circuit package-in-package system 600 is similar in structure to the second stacked integrated circuit package-in-package system 400 of FIG. 4.

The fourth stacked integrated circuit package-in-package system 600 includes the offset stack configuration with a first integrated circuit package system 604 stacked below a second integrated circuit package system 616 and an integrated circuit die 602, such as a flip chip, below the first integrated circuit package system 604. The integrated circuit die 602 is on a package substrate top surface 622 of a package substrate 624.

Die interconnects 644 connect the integrated circuit die 602 and package substrate top contacts 646. First interconnects 648 connect the first integrated circuit package system 604 and the package substrate top contacts 646. Second interconnects 650 connect the second integrated circuit package system 616 and the package substrate top contacts 646. External interconnects 654 connect to package substrate bottom contacts 656.

A package encapsulation 652 has a recess 662 at a top of the package encapsulation 652 exposing a non-peripheral portion of a second package substrate 642 of the second integrated circuit package system 616, wherein the package encapsulation 652 covers the second interconnects 650 on the second package substrate 642. The recess 662 exposes inner contacts 640 of the second package substrate 642 allowing other devices to mount onto the fourth stacked integrated circuit package-in-package system 600 forming a package-on-package configuration. A flip chip 664 and small components 666, such as passive discrete devices, mount on the second package substrate 642 in the recess 662.

Figure 7:
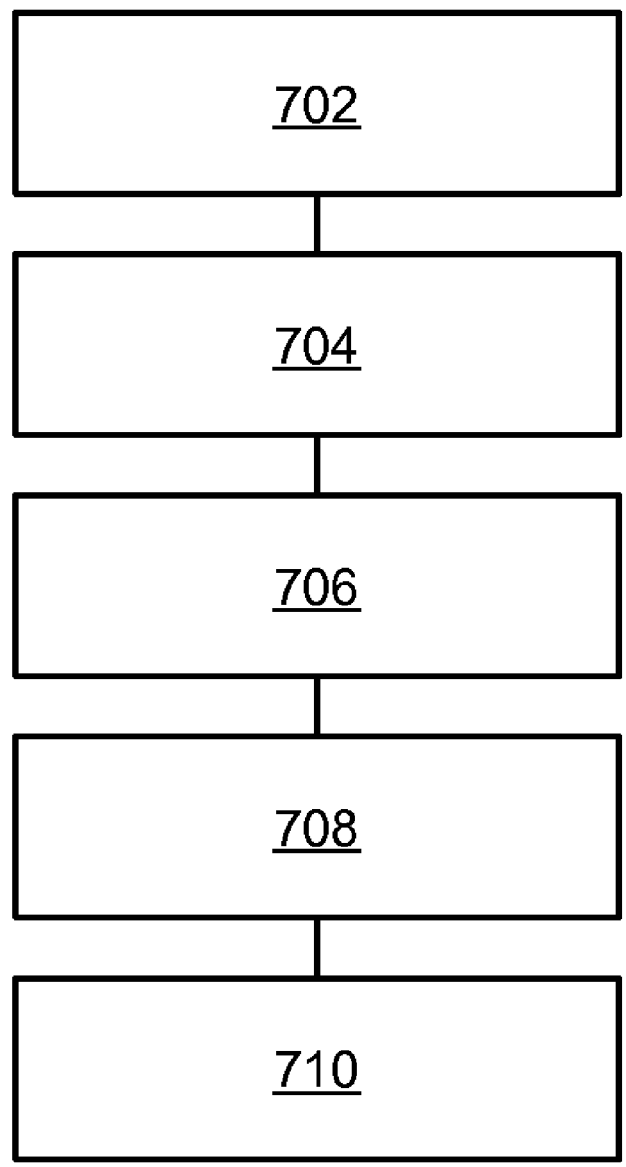
FIG. 7 is a flow chart of a stacked integrated circuit package-in-package system for manufacture of the stacked integrated circuit package-in-package system in an embodiment of the present invention.

Referring now to FIG. 7, therein is shown a flow chart of a stacked integrated circuit package-in-package system 700 for manufacture of the stacked integrated circuit package-in-package system 100 in an embodiment of the present invention. The system 700 includes forming a first integrated circuit package having a first peripheral contact in a block 702; forming a second integrated circuit package having a second peripheral contact in a block 704; stacking the second integrated circuit package on the first integrated circuit package in an offset configuration with the first peripheral contact exposed, the offset configuration provides a second package overhang with the second integrated circuit package above the first integrated circuit package in a block 706; electrically connecting the first peripheral contact and a package substrate contact in a block 708; and connecting the second peripheral contact and the package substrate contact in a block 710.

It has been discovered that the present invention thus has numerous aspects.

It has been discovered that the present invention provides packing more integrated circuits while decreasing overall package height, simplifying manufacturing process, increasing yield, and reducing the overall cost through an offset stack configuration.

An aspect is that the present invention provides the offset stack configuration of pre-packaged devices providing a lower overall package height. Separate spacers are not required for the offset stack configuration.

Another aspect of the present invention is that some or all the integrated circuit devices in the stack are offset such that one side or adjacent sides of the integrated circuit devices are exposed for wire bonding. The bond wires are attached to the offset stack configuration providing a stream line the manufacturing process.

Yet another aspect of the present invention is that the offset configuration offers more flexibility for wire loop heights allowing thinner adhesive layers to be used in the stack. These features improves yield, lowers package height, and reduces overall manufacturing cost.

Thus, it has been discovered that the stacked integrated circuit package-in-package system method of the present invention furnishes important and heretofore unknown and unavailable solutions, capabilities, and functional aspects for improving thermal performance and reliability in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A stacked integrated circuit package-in-package system comprising:
    forming a first integrated circuit package having a first peripheral contact;
    forming a second integrated circuit package having a second peripheral contact;
    stacking the second integrated circuit package on the first integrated circuit package in an offset configuration with the first peripheral contact exposed, the offset configuration provides a second package overhang with the second integrated circuit package above the first integrated circuit package;
    electrically connecting the first peripheral contact and a package substrate top contact;
    forming an integrated circuit die having a peripheral bond pad;
    stacking the first integrated circuit package on an active side of the integrated circuit die in the offset configuration with the peripheral bond pad exposed and a first package overhang above the integrated circuit die; and
    electrically connecting the peripheral bond pad and the package substrate top contact; and
    electrically connecting the second peripheral contact and the package substrate top contact.

2. The system as claimed in claim 1 further comprising:
    forming an integrated circuit die having a non-active side and an active side;
    stacking the first integrated circuit package on the non-active side of the integrated circuit die; and
    electrically connecting the active side and the package substrate top contact.

3. The system as claimed in claim 1 further comprising:
    forming a package substrate having the package substrate top contact; and
    connecting a component on the package substrate under the second package overhang.

4. The system as claimed in claim 1 further comprising:
    forming the second integrated circuit package having a second package substrate, the second package substrate has an inner contact and the second peripheral contact;
    forming an encapsulation having a recess to cover a portion of the second integrated circuit package, the recess exposes the inner contact; and
    connecting a device on the inner contact in the recess.

5. A stacked integrated circuit package-in-package system comprising:
    forming a first integrated circuit package having a first peripheral contact and a first encapsulation;
    forming a second integrated circuit package having a second peripheral contact, an inner contact, and a second encapsulation;
    stacking the second integrated circuit package on the first integrated circuit package in an offset configuration with the first peripheral contact and the second peripheral contact exposed, the offset configuration provides a second package overhang with the second integrated circuit package above the first integrated circuit package;
    electrically connecting the first peripheral contact and a package substrate top contact; and
    electrically connecting the second peripheral contact and the package substrate top contact.

6. The system as claimed in claim 5 further comprising electrically connecting the first peripheral contact and an inner row of package substrate top contacts.

7. The system as claimed in claim 5 further comprising electrically connecting the second peripheral contact and an outer row of package substrate top contacts.

8. The system as claimed in claim 5 further comprising:
    forming first peripheral contacts on adjacent sides of the first integrated circuit package;
    forming second peripheral contacts on adjacent sides of the second integrated circuit package; and
    stacking the second integrated circuit package on the first integrated circuit package in an offset configuration with the first peripheral contacts and the second peripheral contacts exposed.

9. The system as claimed in claim 5 further comprising forming the first integrated circuit package system having a first inner contact and a first peripheral contact.

10. A stacked integrated circuit package-in-package system comprising:
    an integrated circuit die having a peripheral bond pad;
    a first integrated circuit package having a first peripheral contact, the first integrated circuit package on an active side of the integrated circuit die in the offset configuration with the peripheral bond pad exposed and a first package overhang above the integrated circuit die;

a second integrated circuit package having a second peripheral contact, the second integrated circuit package on the first integrated circuit package in an offset configuration with the first peripheral contact exposed, the offset configuration provides a second package overhang with the second integrated circuit package above the first integrated circuit package;

a first interconnect between the first peripheral contact and a package substrate top contact;

a second interconnect between the second peripheral contact and the package substrate top contact; and a third interconnect between the peripheral bond pad and the package substrate top contact.

11. The system as claimed in claim 10 further comprising:

an integrated circuit die having a non-active side and an active side;

the first integrated circuit package on the non-active side the integrated circuit die; and a third interconnect between the active side and the package substrate top contact.

12. The system as claimed in claim 10 further comprising:

a package substrate having the package substrate top contact; and a component on the package substrate under the second package overhang.

13. The system as claimed in claim 10 further comprising:

the second integrated circuit package having a second package substrate, the second package substrate has an inner contact and the second peripheral contact;

an encapsulation having a recess to cover a portion of the second integrated circuit package, the recess exposes the inner contact; and a device on the inner contact in the recess.

14. The system as claimed in claim 10 wherein:

the first integrated circuit package has the first peripheral contact and a first encapsulation;

the second integrated circuit package having the second peripheral contact;

the second integrated circuit package is on the first integrated circuit package in an offset configuration with the first peripheral contact and the second peripheral contact exposed, the offset configuration provides the second package overhang with the second integrated circuit package above the first integrated circuit package;

the first interconnect between the first peripheral contact and the package substrate top contact is a first bond wire;

the second interconnect between the second peripheral contact and the package substrate top contact is a second bond wire; and further comprising:

the second integrated circuit package having an inner contact and a second encapsulation.

15. The system as claimed in claim 14 further comprising the first interconnect between the first peripheral contact and an inner row of package substrate top contacts.

16. The system as claimed in claim 14 further comprising the second interconnect between the second peripheral contact and an outer row of package substrate top contacts.

17. The system as claimed in claim 14 further comprising:

first peripheral contacts on adjacent sides of the first integrated circuit package;

second peripheral contacts on adjacent sides of the second integrated circuit package; and the second integrated circuit package on the first integrated circuit package in an offset configuration with the first peripheral contacts and the second peripheral contacts exposed.

18. The system as claimed in claim 14 further comprising the first integrated circuit package system having a first inner contact and a first peripheral contact.

* * * * *

UNITED STATES PATENT AND TRADEMARK OFFICE
CERTIFICATE OF CORRECTION

PATENT NO. : 7,420,269 B2 Page 1 of 1
APPLICATION NO. : 11/379097
DATED : September 2, 2008
INVENTOR(S) : Ha et al.

It is certified that error appears in the above-identified patent and that said Letters Patent is hereby corrected as shown below:

Title page, item (75) Inventors: Delete "Gwang Kim, Jr." and insert --Gwang Kim--.

Signed and Sealed this

Twenty-first Day of October, 2008

JON W. DUDAS
*Director of the United States Patent and Trademark Office*